(12) United States Patent
Kenzo et al.

(10) Patent No.: US 7,575,460 B2
(45) Date of Patent: Aug. 18, 2009

(54) IC SOCKET

(75) Inventors: Nakao Kenzo, Yokohama (JP); Hsiu-Yuan Hsu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/151,566

(22) Filed: May 7, 2008

(65) Prior Publication Data

US 2008/0280478 A1 Nov. 13, 2008

(30) Foreign Application Priority Data

May 7, 2007 (CN) .......................... 2007 2 0037350

(51) Int. Cl.
*H01R 13/62* (2006.01)
(52) U.S. Cl. .................. 439/331; 439/342; 324/755
(58) Field of Classification Search ......... 439/330–331, 439/342
See application file for complete search history.

(56) References Cited

U.S. PATENT DOCUMENTS

| | | | | |
|---|---|---|---|---|
| 4,657,328 A | * | 4/1987 | Matsuoka | 439/331 |
| 6,280,219 B1 | * | 8/2001 | Sano et al. | 439/268 |
| 6,752,645 B2 | * | 6/2004 | Nakamura et al. | 439/330 |
| 7,407,401 B2 | * | 8/2008 | Morinari | 439/331 |
| 2001/0051294 A1 | | 12/2001 | Inoue et al. | |
| 2003/0045148 A1 | | 3/2003 | Watanabe | |
| 2003/0109163 A1 | | 6/2003 | Shimada | |

FOREIGN PATENT DOCUMENTS

| | | |
|---|---|---|
| JP | 2002-25587 | 1/2002 |
| JP | 2002-343522 | 11/2002 |

* cited by examiner

*Primary Examiner*—Truc T Nguyen
(74) *Attorney, Agent, or Firm*—Wei Te Chung

(57) ABSTRACT

An IC socket for receiving an IC package includes a socket body with a plurality of contacts disposed therein, a lid mounted on the socket body and movable relative to the socket body in an up-down direction, and a pressing mechanism driven by the lid. The pressing mechanism has a pusher able to apply a substantial balanced force to the IC package, and thus any distortion of the IC package will be prevented effectively.

13 Claims, 10 Drawing Sheets

IC SOCKET

BACKGROUND OF THE INVENTION

1. Field of the Invention

This invention relates to a socket, and more particularly, to a socket for receiving an electronical element, such as an IC (integrated circuit) package.

2. Description of the Related Art

Usually, a socket is needed to receive an IC package and make electrical connection between the IC package and a circuit board on which the socket is mounted. A conventional socket which is used for receiving an IC package is disclosed in Japanese patent application publication NO. 2002-343522. Referring to its FIG. 1, FIG. 2 and FIG. 6, the IC socket comprises a socket body 10 and a platform 30 located above the socket body 10 for loading an IC package 4. A pair of latches 32 are provided to press two sides of the IC package 4 and position the IC package 4 in the IC socket. Since only two sides of the IC package 4 are pressed, an unbalanced force which is exerted on a top surface of the IC package 4 may bring a distortion of the IC package 4, especially in the case that a great force is exerted on the IC package with a small thickness.

BRIEF SUMMARY OF THE INVENTION

Accordingly, it is an object of the present invention to provide an IC socket with an pressing mechanism.

To achieve the above object, an IC socket includes a socket body with a plurality of contacts disposed therein, a lid mounted on the socket body and movable relative to the socket body, and a pressing mechanism comprising a supportor set on the socket body, a pusher and a lever, one end of the lever engaging with the lid, the other end of the lever being connected to the pusher, and one portion of the lever between said two ends being supported by the supportor.

It is another object of the present invention to provide an IC socket able to apply a balanced force to an IC package.

To achieve the above object, an IC socket for receiving an IC package includes a socket body with a plurality of contacts disposed therein, a lid mounted on the socket body and movable relative to the socket body in an up-down direction, and a pressing mechanism driven by the lid, said pressing mechanism having a pusher able to apply a substantial balanced force to the IC package.

DETAILED DESCRIPTION OF THE INVENTION

Figure 1:
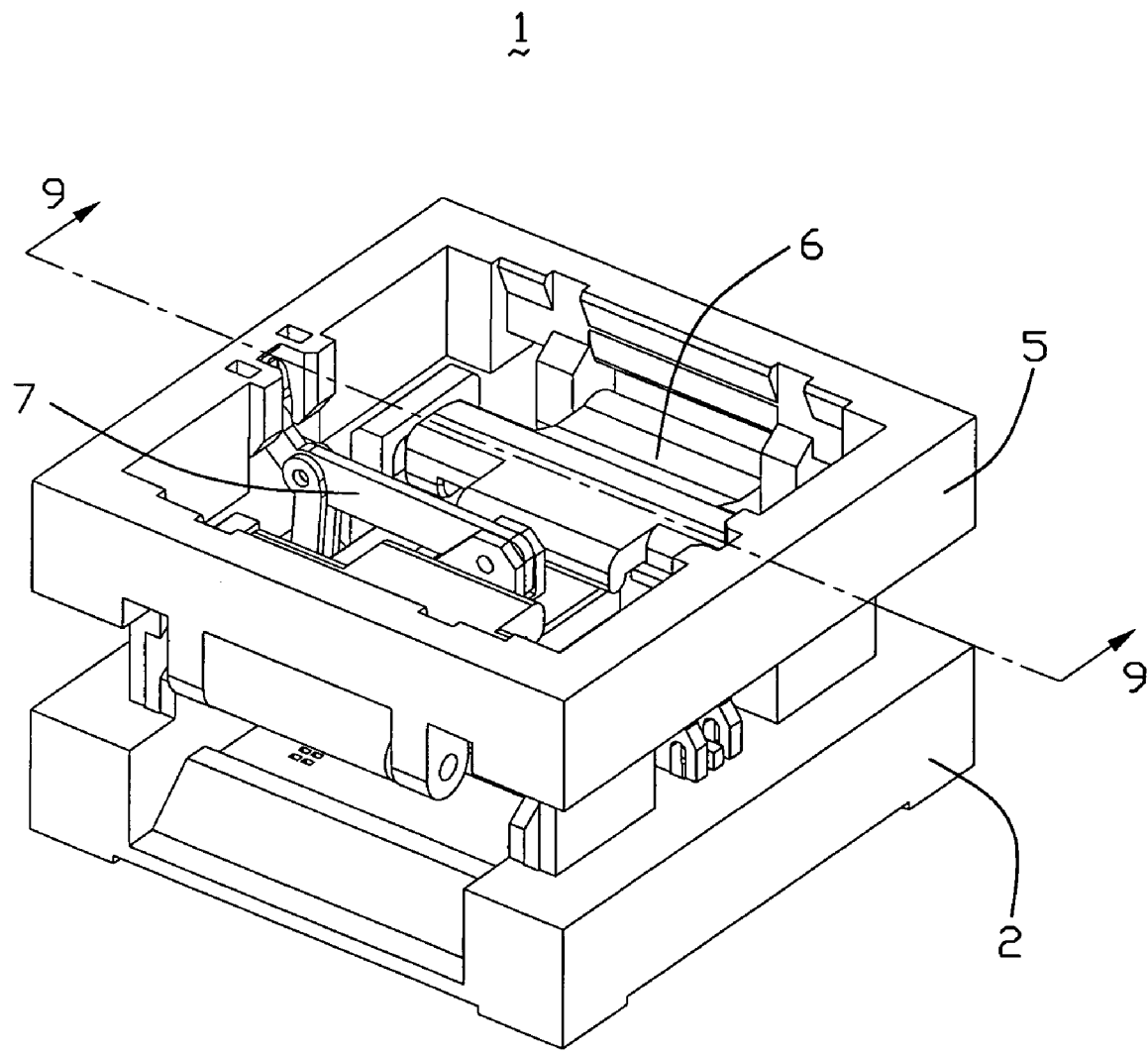
FIG. 1 is an assembled, perspective view of an IC socket in a close position according to an embodiment of the present invention.
Figure 2:
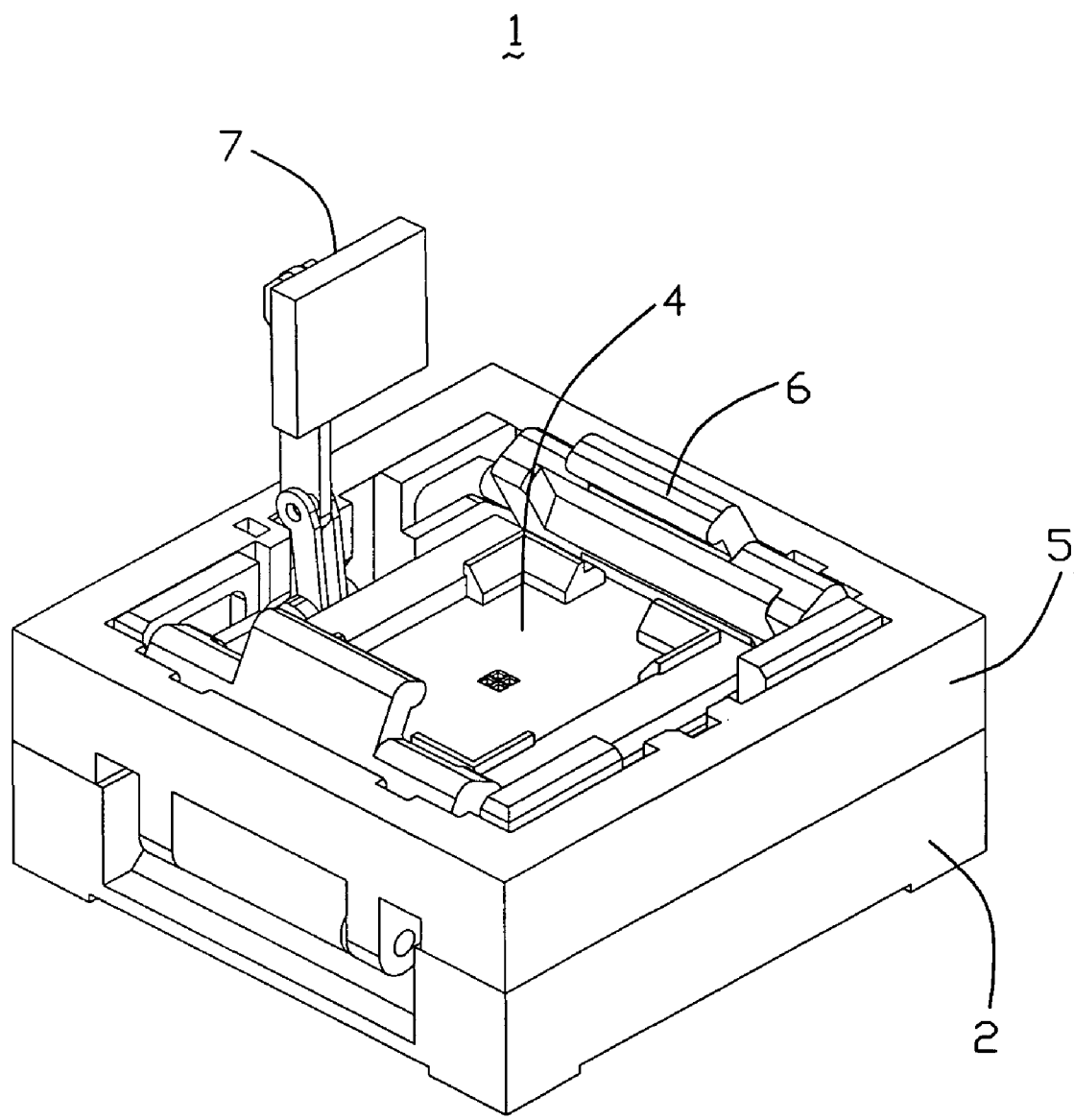
FIG. 2 is an assembled, perspective view of the IC socket in an open position according to the embodiment of the present invention.
Figure 3:
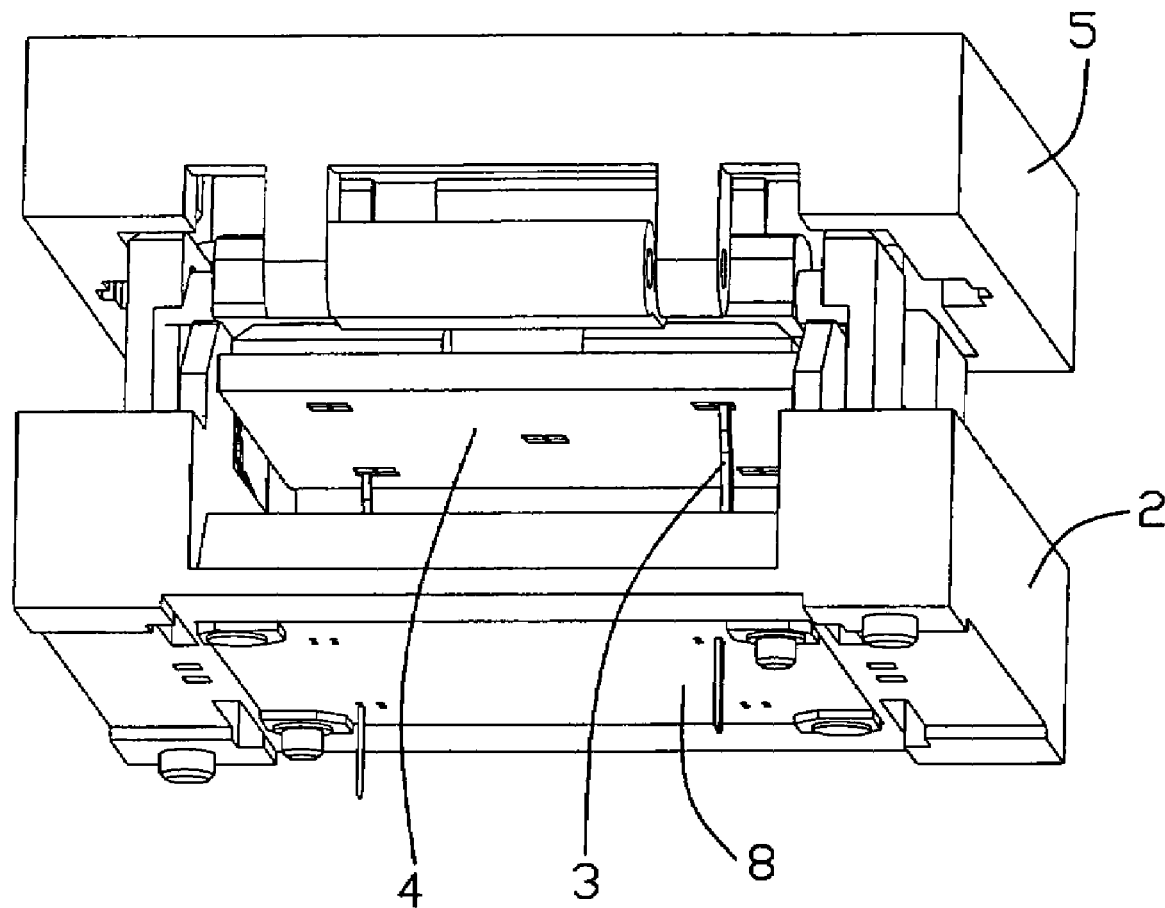
FIG. 3 is a perspective view of the IC socket in FIG. 1 taken from another angle.
Figure 4:
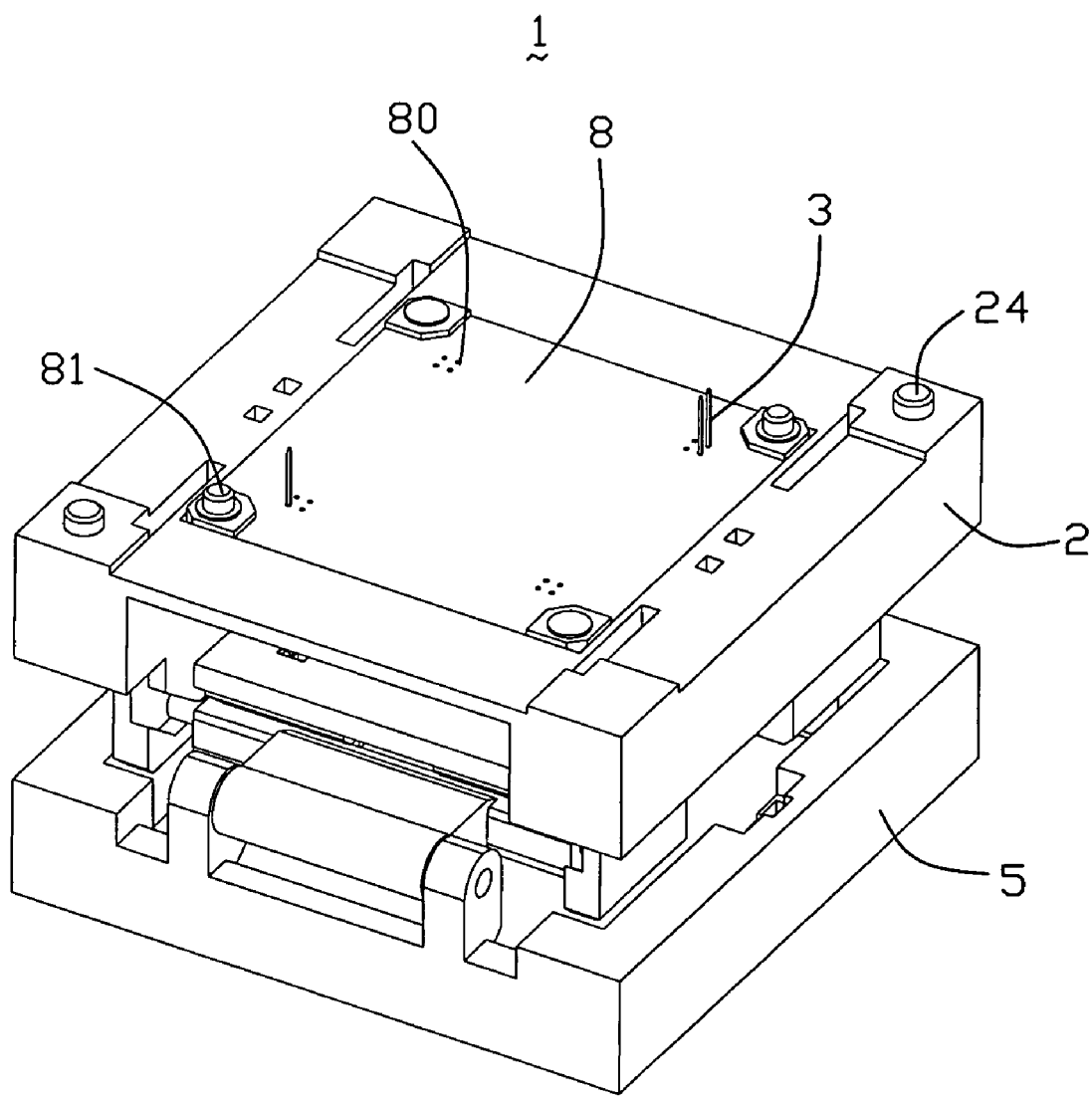
FIG. 4 is a perspective view of the IC socket in FIG. 1 taken from a bottom angle.

Referring to FIG. 1 to FIG. 4, an IC socket 1 for receiving an IC package (not shown) according to an embodiment of the invention mainly includes a socket body 2 mounted to a printed circuit board (not shown), a plurality of contacts 3 disposed in the socket body 2, a lid 5 mounted on the socket body 2 and being movable relative to the socket body 2 in an up-down direction, a pressing mechanism 7 driven by the lid 5 and a pair of latches 6 engaging with the lid 5. FIG. 1 illustrates the IC socket 1 in a close position while the lid 5 is in a high position, and FIG. 2 illustrates the IC socket 1 in an open position while the lid 5 keeps in a low position.

Figure 5:
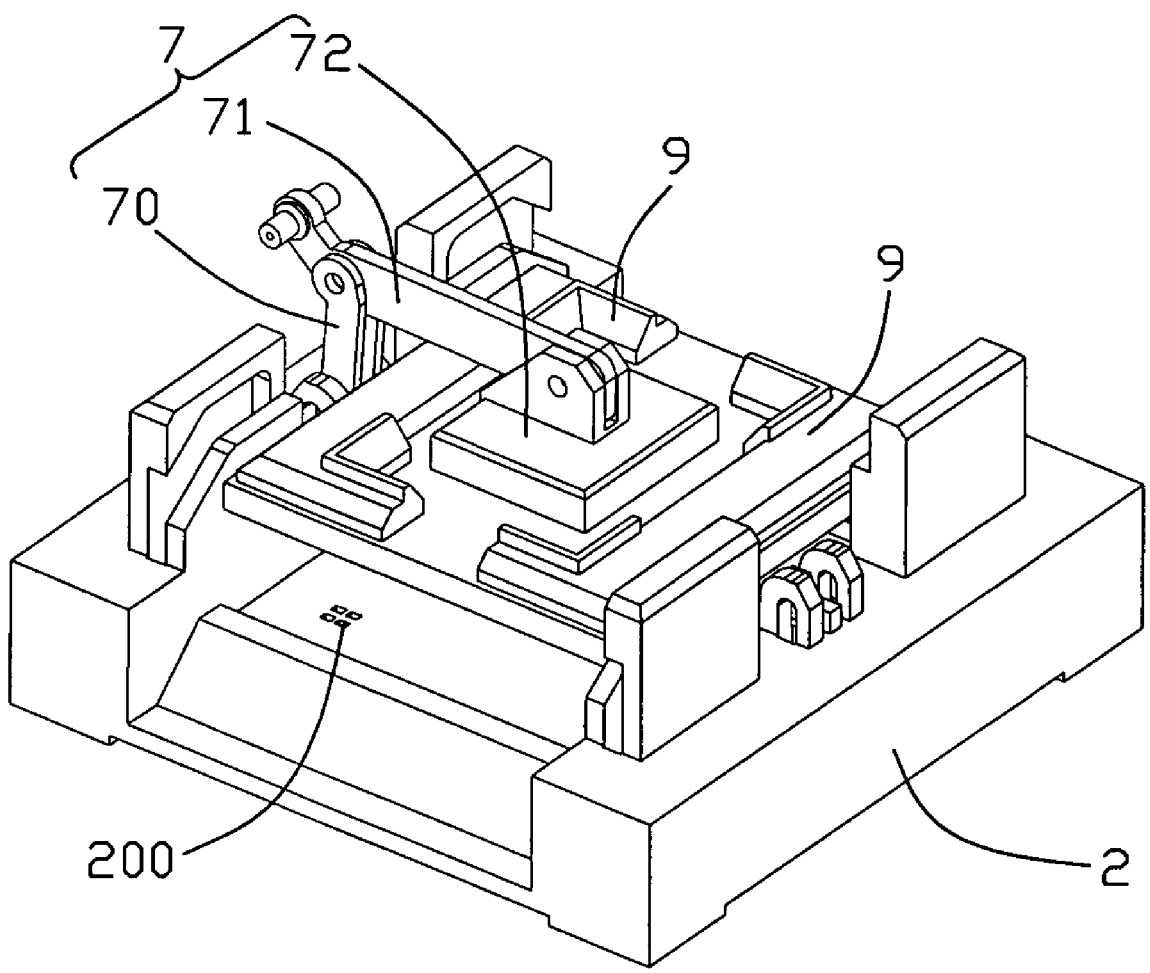
FIG. 5 is a partially assembled, perspective view of the IC socket according to the embodiment of the present invention.
Figure 6:
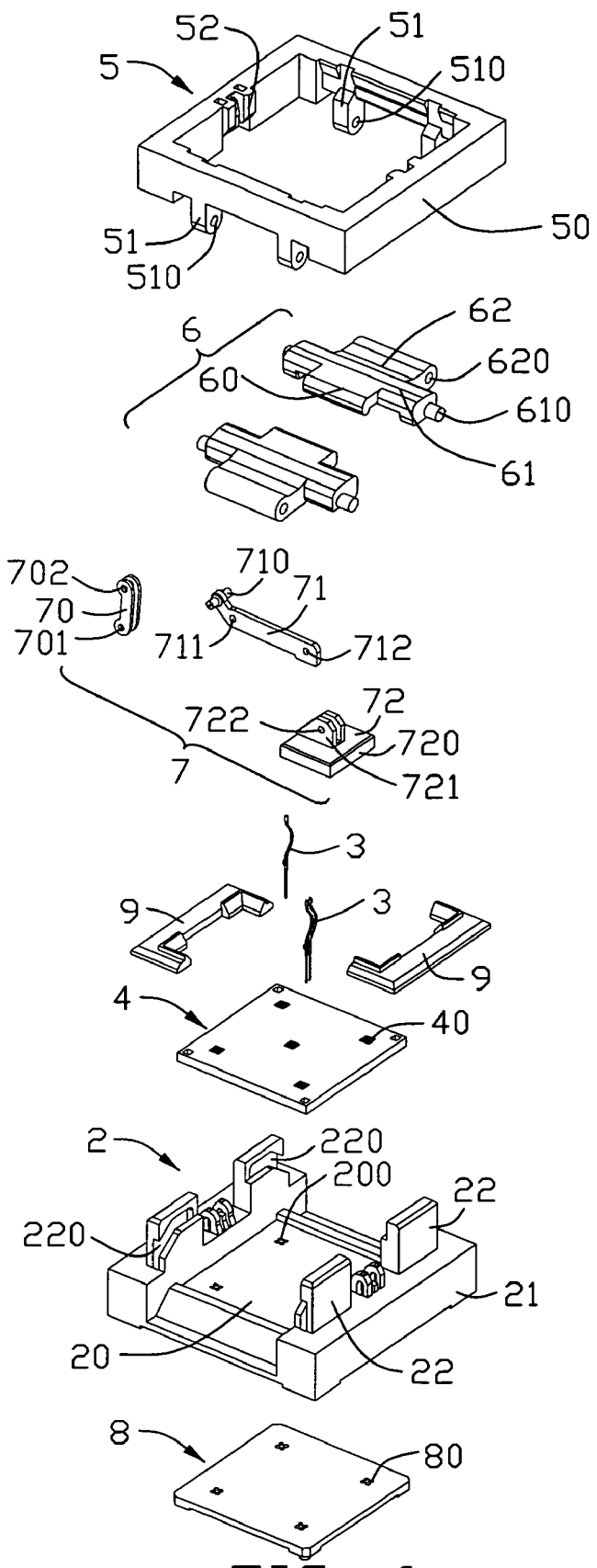
FIG. 6 is an exploded, perspective view of the IC socket according to the embodiment of the present invention.
Figure 7:
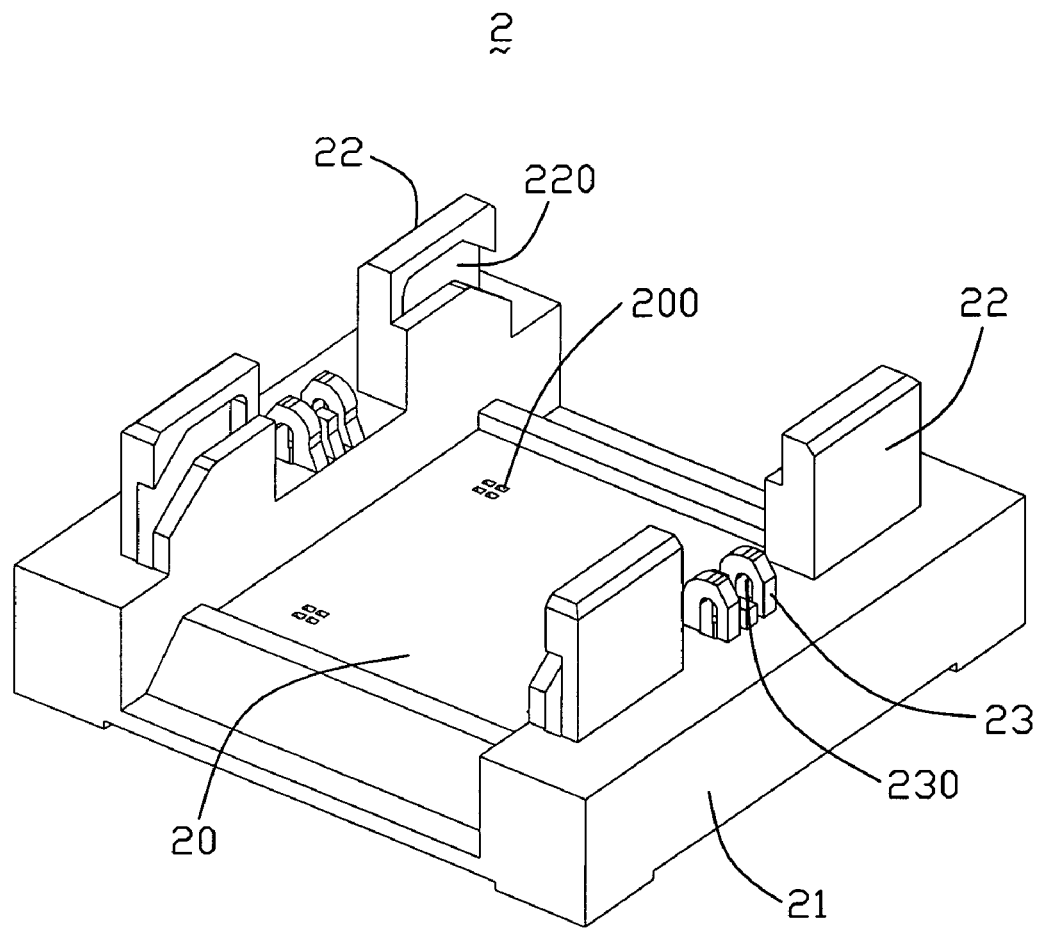
FIG. 7 is a perspective view of a socket body of the IC socket according to the embodiment of the present invention.

Referring to FIG. 5 to FIG. 7 particularly, the socket body 2 mainly includes a base 20 with a plurality of passageways 200 for receiving of the contacts 3, and a pair of side portions 21 formed on two opposite sides of the base 20. Each of the side portions 21 has a pair of sidewalls 22 extending upwardly therefrom, and each of the sidewalls 22 is formed with a slot 220 engaging with the latch 6. A pair of holding portions 23 respectively defining a connecting hole 230 therein are formed between two sidewalls 22 on each of the side portions 21. The holding portions 23 are used for connecting the pressing mechanism 7. A bottom plate 8 is provided on the bottom of the socket body 2, with a plurality of passageways 80 therein for the receiving of the contacts 3.

Referring to FIG. 2, FIG. 3, FIG. 6 and FIG. 9 particularly, a floating plate 4 is positioned on the socket body 2 for loading the IC package. A plurality of passageways 40 are formed in the floating plate 4 for the receiving of the contacts 3, and enable the IC package to be connected electrically with the contacts 3. Referring to FIG. 5 and FIG. 6, a pair of U-shape frames 9 are provided and placed on two sides of the floating plate 4 to restrict the movement of the IC package. In this embodiment of the present invention, at least one elastic element, for example, a coil spring (not shown) is provided between the base 20 and the floating plate 4. When the floating plate 4 moves downwardly because of the IC package being pressed, the elastic element is compressed and generates an elastic force that is contributory to the upward restoration of the floating plate 4 when the floating plate 4 is released.

Figure 8:
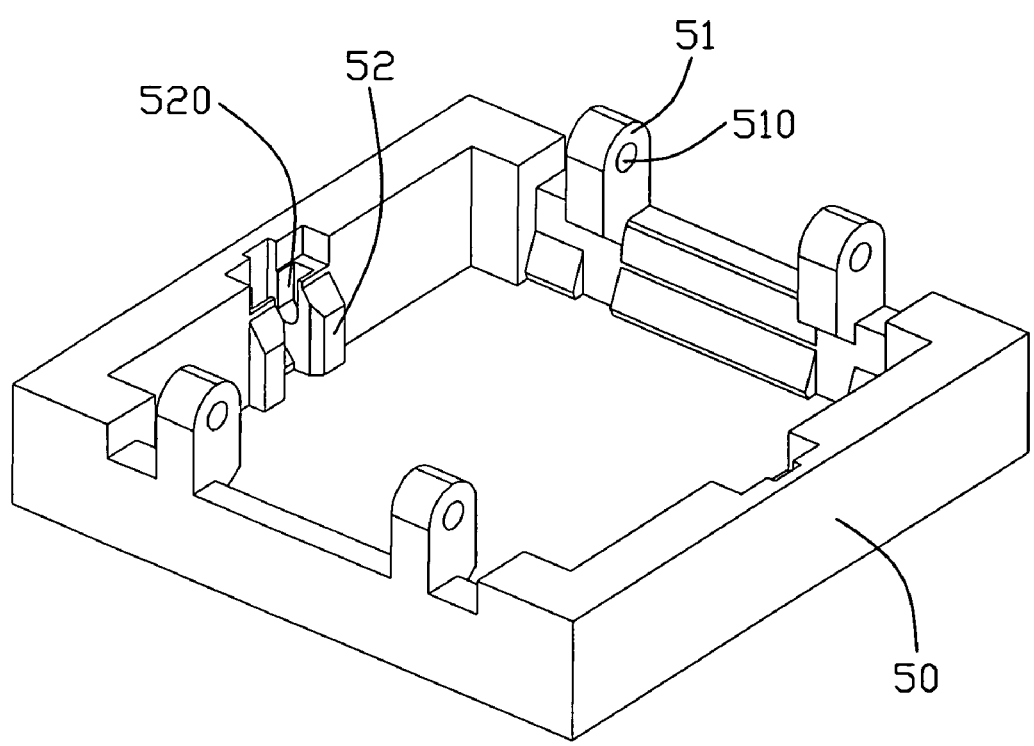
FIG. 8 is a perspective view of a lid of the IC socket according to the embodiment of the present invention.
Figure 9:
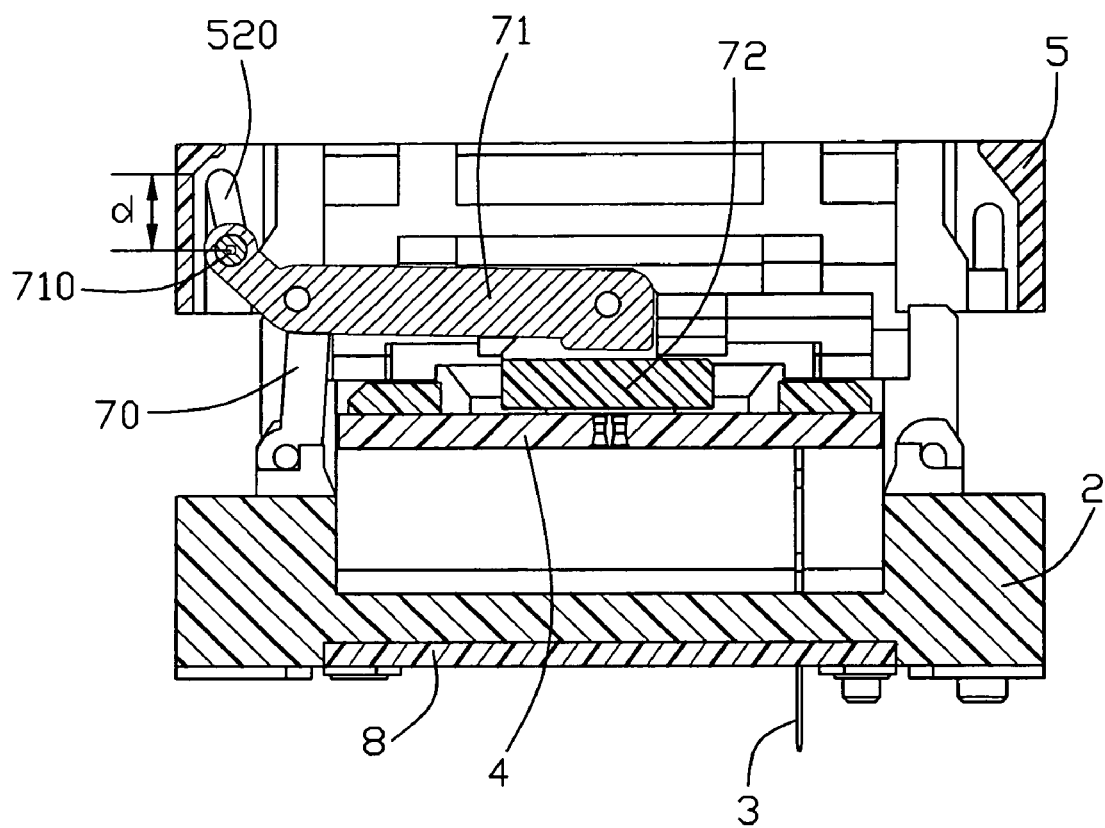
FIG. 9 is a cross-section view taken along a line 9-9 in FIG. 1.

Referring to FIG. 6, FIG. 8 and FIG. 9 particularly, the lid 5 is mounted on the socket body 2 and movable relative to the socket body 2 in an up-down direction. The lid 5 is substantially formed with four rims 50. A pair of opposite rims 50 respectively have a pair of connecting portions 51. Each of the connecting portions 51 has a hole 510 for connecting the latch 6. The other pair of opposite rims 50 respectively have a pair of retaining portions 52. Each of the retaining portions 52 is formed with a guiding slot 520 for engaging with the pressing mechanism 7.

Referring to FIG. 1, FIG. 2 and FIG. 6 particularly, the latches 6 are connected to the lid 5 and driven by the lid 5. Each of the latches 6 includes a latching portion 60, an extending portion 61 with a pair of shafts 610 extending outwardly respectively from two ends therein and a rotating portion 62 connected to the lid 5. The shafts 610 slide in the slots 220 of the socket body 2. The rotating portion 62 is positioned between the connecting portions 51, and is formed with a through hole 620 corresponding to the connecting holes 510 of the connecting portions 51. A rod (not shown) is used for connecting the latch 6 with the lid 5 by being inserted through the holes 510 and the through hole 620.

Referring to FIG. 1, FIG. 2, FIG. 5, FIG. 6 and FIG. 9 particularly, the pressing mechanism 7 is connected to the socket body 2 and the lid 5, and comprises a supporter 70 set on the socket body 2, a lever 71 and a pusher 72. One end of the lever 71 engages with the lid 5, the other end is connected to the pusher 72. The supporter 70 is composed of two plates, with each being formed with holes 701, 702 at two ends thereof. The holes 701 correspond with the connecting holes 230 of the holding portions 23, and the holes 702 correspond with a hole 711 formed at one portion of the lever 72, between two ends of the lever 72. The connection between the supportor 70 and the lever 71 can be achieved by a rod or other means. A shaft 710 is provided at the end of the lever 71 and is able to slide in the guiding slot 520 relative to the lid 5. The other end of the lever 71 is connected to the pusher 72 and formed with a hole 712. The pusher 72 has a board body 720 with a planar plane able to touch a top surface of the IC package, and two linking portions 721 formed respectively with a hole 722. The hole 712 of the lever 71 and the holes 722 of the pusher 72 are engaging with a rod (not shown), and therefore the pusher 72 is rotatable relative to the lever 71. Since the pusher 72 has a wide enough planar plane at the bottom thereof to touch the top surface of the IC package, the force exerted on the IC package is balanced, and will not focus on a special part or special parts, thus a distortion of the IC package is prevented even if the IC package has a small thickness.

Referring to FIG. 1, the IC socket 1 is in a close position, with the lid 5 far away from the socket body 2. The latches 6 press the pusher 72. When the lid 5 is applied with an operating force and moves downwardly, the lid 5 drives the latches 6 to rotate relative to the lid 5 and the socket body 2. The shafts 610 of the latches 6 slide in the slot 220 of the socket body 2. Referring to FIG. 9, during the initial process of the downward movement of the lid 5, the pressing mechanism 7 will not be actuated because of a distance (labeled as "d") existing between the top of the guiding slot 520 and the shaft 710. So the latches 6 rise up before the pusher 72, and will not interfere the movement of the pusher 72 at the next process. When the top of the guiding slot 520 presses against the shaft 710, the pressing mechanism 7 will be driven by the lid 5 and begins to be actuated. The end of the lever 71 with the shaft 710 thereof moves downwardly, and the other end having the pusher 72 thus moves upwardly because of the supportor 70 supporting the lever 71 at one portion between the two ends. Until the lid 5 reaches a predetermined position, the IC socket 1 arrives an open position (referring to FIG. 2). Now an IC package can be put into the IC socket 1 and loaded on the floating plate 4 and between the U-shape frames 9. Releasing the operating force applied on the lid 5, the lid 5 can move upwardly via a gravity of the pusher 72. The pusher 72 descends downwardly and presses on the IC package prior to the latches 6. The latches 6 press the pusher 72 when the IC socket 1 gets back to the close position. Because the pusher 72 has a planar plane touching on the IC package, the force exerted the IC package is substantially balanced, and thus any distortion of IC package is prevent effectively.

Figure 10:
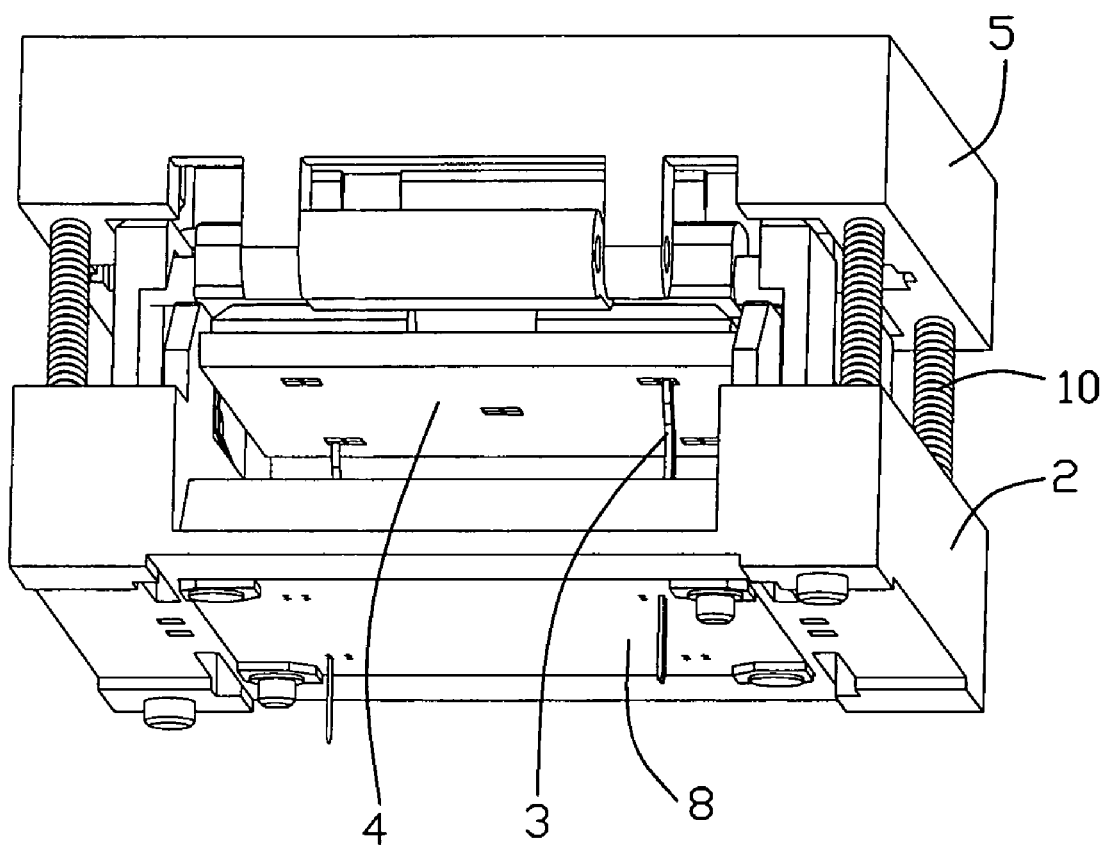
FIG. 10 is an assembled, perspective view of the IC socket according to the embodiment of the present invention, wherein elastic elements are shown.

Referring to FIG. 10, elastic elements, for example, coil springs 10 are provided between the lid 5 and the socket body 2. One end of the coil spring 10 engages with the lid 5, and the other end engages with the socket body 2. When the IC socket 1 is turned from the close position to the open position, the coil spring 10 compresses and generates a elastic force. When the IC socket 1 is turned from the open position to the close position, the coil spring 10 restitutes and drives the lid 5 to move upwardly, and meanwhile, the pusher 72 presses on the IC package tightly and stably.

Further the planar plane at the bottom of the pusher 72 can be replaced by other means. For example, a uniform grid of embosses can be attached on the bottom of the pusher 72, and touch the IC package directly. A nearly same function that provides a substantial balanced force to the IC package can be achieved.

What is claimed is:

1. An integrated circuit socket comprising:
   a socket body with a plurality of contacts disposed therein;
   a lid mounted on the socket body and movable relative to the socket body; and a pressing mechanism comprising an elongated supporter vertically set on the socket body, a pusher and a lever, one end of the lever engaging with the lid, the other end of the lever being connected to the pusher, and one portion of the lever between said two ends being supported by the supporter;
   wherein the lid has a guiding slot and the lever has a shaft able to slide in the guiding slot relative to the lid;
   wherein the pusher has a planar plate at the bottom thereof;
   wherein the pusher is rotatable relative to the elongated supporter.

2. The integrated circuit socket according to claim 1, wherein a pair of latches are provided to press the pusher, said latches being driven by the lid.

3. The integrated circuit socket according to claim 1, wherein at least one elastic element is provided for engaging with the socket body and the lid, said elastic element compressing and generating a elastic force when the IC socket is turned from a close position to an open position.

4. The integrated circuit socket according to claim 1, wherein a floating plate with a plurality of passageways therein is positioned on the socket body.

5. The integrated circuit socket according to claim 4, wherein the socket body comprises a base and a plurality of sidewalls extending upwardly at two opposite sides of the base.

6. The integrated circuit socket according to claim 5, wherein a pair of frames are placed on two sides of the floating plate.

7. An integrated circuit socket for receiving an integrated circuit package comprising:
   a socket body with a plurality of contacts disposed therein;
   a lid mounted on the socket body and movable relative to the socket body in an up-down direction; and
   a pressing mechanism driven by the lid, said pressing mechanism having a pusher able to apply to a substantial balanced force to the integrated circuit package;
   wherein the pressing mechanism has a lever with one end connected to the pusher and the other end engaging with the lid and an elongated supporter vertically set on the socket body and between two ends of the lever to support the lever;
   wherein the lid has a guiding slot and the lever has a shaft able to slide in the guiding slot relative to the lid;
   wherein the pusher has a planar plate at the bottom thereof touching the integrated circuit package;
   wherein the pusher is rotatable relative to the elongated supporter.

8. The integrated circuit socket according to claim 7, wherein a pair of latches are provided to press the pusher, said latches being driven by the lid.

9. The integrated circuit socket according to claim 8, wherein at least one elastic element is provided for engaging with the socket body and the lid, said elastic element compressing and generating a elastic force when the IC socket is turned from a close position to an open position.

10. The integrated circuit socket according to claim 9, wherein a floating plate with a plurality of passageways therein is positioned on the socket body.

11. The integrated circuit socket according to claim 10, wherein the socket body comprises a base and a plurality of sidewalls extending upwardly at two opposite sides of the base.

12. An integrated circuit socket comprising:
- a socket body with a plurality of contacts disposed therein;
- a lid mounted on the socket body and up and down movable relative to the socket body; and
- a pressing mechanism comprising an elongated supporter vertically set on the socket body, a pusher and a lever linked said elongated supporter and said pusher both in a pivotal manner; wherein
- the lever is actuated by said lid;
- wherein the lever with one end connected to the pusher and the other end engaging with the lid;
- wherein the lid has a guiding slot and the lever has a shaft able to slide in the guiding slot relative to the lid;
- wherein the pusher has a planar plate at the bottom thereof touching the integrated circuit package;
- wherein the pusher is rotatable relative to the elongated supporter.

13. The integrated circuit socket as claimed in claim 12, wherein said lever and said lid are associated for actuation via an assembly a slot and a pin.

\* \* \* \* \*